(12) United States Patent
Sasaki et al.

(10) Patent No.: US 11,710,618 B2
(45) Date of Patent: Jul. 25, 2023

(54) ION IMPLANTER AND ELECTROSTATIC QUADRUPOLE LENS DEVICE

(71) Applicant: SUMITOMO HEAVY INDUSTRIES ION TECHNOLOGY CO., LTD., Tokyo (JP)

(72) Inventors: Haruka Sasaki, Ehime (JP); Kouji Inada, Ehime (JP); Hayao Kawai, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 17/683,895

(22) Filed: Mar. 1, 2022

(65) Prior Publication Data
US 2022/0285127 A1     Sep. 8, 2022

(30) Foreign Application Priority Data

Mar. 2, 2021   (JP) ................... 2021-032815

(51) Int. Cl.
*H01J 37/317*    (2006.01)
*H01J 37/18*     (2006.01)
*H01J 37/12*     (2006.01)

(52) U.S. Cl.
CPC .......... *H01J 37/3171* (2013.01); *H01J 37/12* (2013.01); *H01J 37/18* (2013.01); *H01J 2237/04735* (2013.01)

(58) Field of Classification Search
CPC .. H01J 37/10; H01J 37/12; H01J 37/18; H01J 37/20; H01J 37/24; H01J 37/21; H01J 37/244; H01J 37/3008; H01J 37/3171; H01J 2237/16; H01J 2237/049; H01J 2237/182; H01J 2237/04735; H01J 2237/31705;
(Continued)

(56) References Cited

U.S. PATENT DOCUMENTS 5,504,341 A     4/1996  Glavish
9,336,992 B2 *  5/2016  Amano ............... H01J 37/3171
(Continued)

FOREIGN PATENT DOCUMENTS

JP    2002-329471 A    11/2002
JP    2016-009551 A     1/2016

*Primary Examiner* — David E Smith
*Assistant Examiner* — Hsien C Tsai
(74) *Attorney, Agent, or Firm* — Michael Best & Friedrich LLP

(57) ABSTRACT

An ion implanter includes a high energy multistage linear acceleration unit for accelerating an ion beam. The high energy multistage linear acceleration unit includes high frequency accelerators in a plurality of stages provided along a beamline through which the ion beam travels, and electrostatic quadrupole lens devices in a plurality of stages provided along the beamline. The electrostatic quadrupole lens device in each of the stages includes a plurality of lens electrodes facing each other in a radial direction perpendicular to an axial direction, and disposed at an interval in a circumferential direction, an upstream side cover electrode covering a beamline upstream side of the plurality of lens electrodes and including a beam incident port, and a downstream side cover electrode covering a beamline downstream side of the plurality of lens electrodes and including a beam exiting port.

20 Claims, 10 Drawing Sheets

(58) Field of Classification Search
CPC ....... H01J 2237/1215; H01J 2237/1415; H01J 2237/038
See application file for complete search history.

(56) References Cited

U.S. PATENT DOCUMENTS

2002/0148971 A1    10/2002  Sogard
2022/0238302 A1*   7/2022  Futakuchi ........... H01J 37/3023

* cited by examiner

ION IMPLANTER AND ELECTROSTATIC QUADRUPOLE LENS DEVICE

RELATED APPLICATIONS

The content of Japanese Patent Application No. 2021-032815, on the basis of which priority benefits are claimed in an accompanying application data sheet, is in its entirety incorporated herein by reference.

BACKGROUND

Technical Field

Certain embodiments of the present invention relate to an ion implanter and an electrostatic quadrupole lens device.

Description of Related Art

In a semiconductor manufacturing process, a process of implanting ions into a semiconductor wafer (also referred to as an ion implantation process) is generally performed in order to change conductivity of a semiconductor, or in order to change a crystal structure of the semiconductor. A device used for the ion implantation process is called an ion implanter. Implantation energy of the ions is determined depending on a desired implantation depth of the ions implanted near a surface of the wafer. A high energy (for example, 1 MeV or higher) ion beam is used for implantation into a relatively deep region.

In the ion implanter capable of outputting the high energy ion beam, the ion beam is accelerated by using a multistage high frequency linear acceleration unit (LINAC). For example, the high frequency linear acceleration unit includes high frequency accelerators in a plurality of stages for accelerating the ion beam and electrostatic quadrupole lens electrodes in a plurality of stages for converging the ion beam.

SUMMARY

According to an embodiment of the present invention, there is provided an ion implanter including a high energy multistage linear acceleration unit for accelerating an ion beam. The high energy multistage linear acceleration unit includes high frequency accelerators in a plurality of stages provided along a beamline through which the ion beam travels, and electrostatic quadrupole lens devices in a plurality of stages provided along the beamline. The electrostatic quadrupole lens device in each of the stages includes a plurality of lens electrodes facing each other in a radial direction perpendicular to an axial direction in which the beamline extends while the beamline is interposed between the plurality of lens electrodes facing each other, and disposed at an interval in a circumferential direction perpendicular to both the axial direction and the radial direction, an upstream side cover electrode covering a beamline upstream side of the plurality of lens electrodes, and including a beam incident port opening in the axial direction, and a downstream side cover electrode covering a beamline downstream side of the plurality of lens electrodes, and including a beam exiting port opening in the axial direction. At least one of the upstream side cover electrode and the downstream side cover electrode which are included in the electrostatic quadrupole lens device in at least one of the plurality of stages includes at least one gas exhaust port opening in the radial direction.

According to another embodiment of the present invention, there is provided an electrostatic quadrupole lens device. The electrostatic quadrupole lens device includes a plurality of lens electrodes facing each other in a radial direction perpendicular to an axial direction in which a beamline extends while the beamline is interposed between the plurality of lens electrodes facing each other, and disposed at an interval in a circumferential direction perpendicular to both the axial direction and the radial direction, an upstream side cover electrode covering a beamline upstream side of the plurality of lens electrodes, and including a beam incident port opening in the axial direction, and a downstream side cover electrode covering a beamline downstream side of the plurality of lens electrodes, and including a beam exiting port opening in the axial direction. At least one of the upstream side cover electrode and the downstream side cover electrode includes at least one gas exhaust port opening in the radial direction.

DETAILED DESCRIPTION

Figure 1:
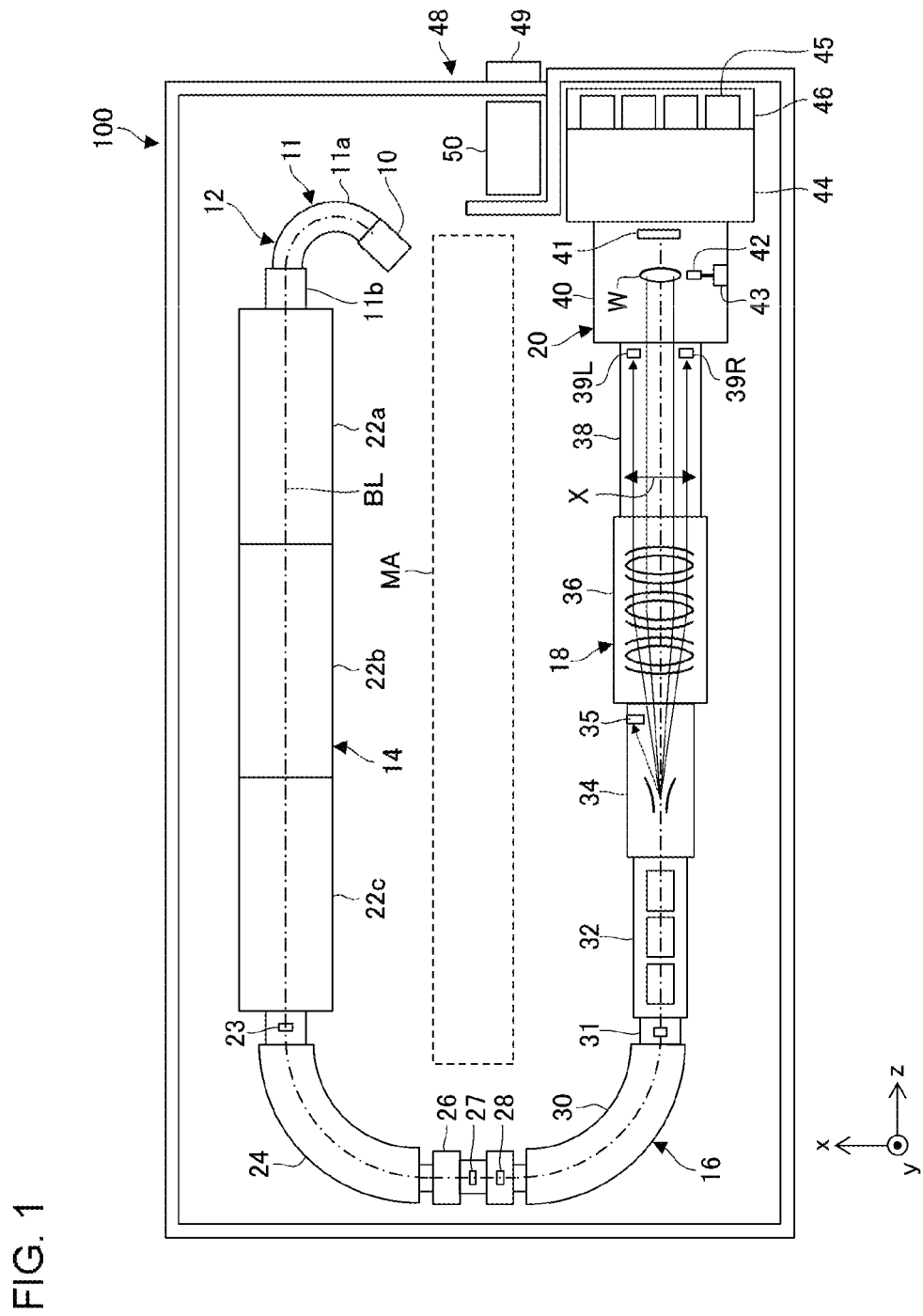
FIG. 1 is a top view illustrating a schematic configuration of an ion implanter according to an embodiment of the present invention.

Recently, an ultra-high energy (for example, 4 MeV or higher) ion beam is required for implantation into a deeper region. In order to generate the ultra-high energy ion beam, it is necessary to further increase acceleration voltages applied to the high frequency accelerators and to further increase focusing/defocusing voltages applied to lens electrodes. When the voltages applied to the lens electrodes increase, discharge is likely to occur between the electrodes. In particular, when the ion beam collides with an electrode body of the lens electrode, the electrode body is sputtered, and a sputtered substance adheres to and contaminates the electrode body or an insulating member supporting the electrode body, the discharge is more likely to occur. In addition, multiply charged ions may be used to generate the ultra-high energy ion beam. When a degree of vacuum in a beamline decreases, the multiply charged ions interact with gas remaining in the beamline, and a charge state of the multiply charged ion tends to be lowered.

It is desirable to provide a technique for suppressing dirt adhering to an electrode body included in an electrostatic quadrupole lens device or an insulating member supporting the electrode body, and improving a degree of vacuum of a beamline.

Any desired combination of the above-described components, and those in which the components or expressions according to the present invention are substituted from each other in methods, devices, or systems are effectively applicable as an aspect of the present invention.

According to an aspect of the present invention, it is possible to suppress dirt adhering to the electrode body included in the electrostatic quadrupole lens device or the insulating member supporting the electrode body, and to improve the degree of vacuum of the beamline.

Hereinafter, embodiments according to the present invention will be described in detail with reference to the drawings. In describing the drawings, the same reference numerals will be assigned to the same elements, and repeated description will appropriately be omitted. Configurations described below are merely examples, and do not limit the scope of the present invention in any way.

Before the embodiments are described in detail, an outline will be described. The present embodiment relates to an ion implanter for high energy ion beam. The ion implanter causes a high frequency linear acceleration unit to accelerate an ion beam generated by an ion source, transports a high energy ion beam obtained by the acceleration to a workpiece (for example, a substrate or a wafer) along a beamline, and implants ions into the workpiece. In the following description, in order to facilitate understanding, an example will be described on the premise that the "workpiece (for example, the substrate or the wafer)" is the "wafer". However, the ion implantation method and the ion implanter according to the present disclosure is not limited to the example. For example, a specific example of the "workpiece (for example, the substrate or the wafer)" includes not only a semiconductor wafer but also a flat panel display substrate (for example, a glass substrate).

The term "high energy" in the present embodiment means beam energy of 1 MeV or higher, 4 MeV or higher, or 10 MeV or higher. According to high energy ion implantation, desired dopant ions are implanted into a wafer surface with relatively high energy. Therefore, the desired dopant ions can be implanted into a deeper region (for example, a depth of 5 μm or larger) of the wafer surface. For example, an application field of the high energy ion implantation is to form a P-type region and/or an N-type region in manufacturing a semiconductor device such as a state-of-the-art used image sensor.

The high frequency linear acceleration unit includes high frequency accelerators in a plurality of stages for accelerating the ion beam and electrostatic quadrupole lens devices in a plurality of stages for focusing/defocusing the ion beam. The electrostatic quadrupole lens device includes a plurality of lens electrodes facing each other while the beamline is interposed between the plurality of lens electrodes facing each other, an upstream side cover electrode covering a beamline upstream side of the plurality of lens electrodes, and a downstream side cover electrode covering a beamline downstream side of the plurality of lens electrodes. Each of the upstream side cover electrode and the downstream side cover electrode has a beam passage port through which the ion beam passes, and functions as a ground electrode.

In order to generate a higher energy ion beam, it is necessary to further increase the acceleration voltages applied to the high frequency accelerators and to further increase the focusing/defocusing voltages applied to the lens electrode. When the voltages applied to the lens electrodes increase, discharge is likely to occur between the lens electrode and the cover electrode. The electrode body of the lens electrode or the cover electrode is disposed close to the beamline. Accordingly, the electrode body is sputtered due to collision of the ion beam. When the sputtered substance adheres to the electrode body or the insulating member supporting the electrode body, and the electrode body or the insulating member supporting the electrode body is contaminated, discharge is more likely to occur between the electrode bodies. In addition, in a space between the upstream side cover electrode and the downstream side cover electrode of each of the electrostatic quadrupole lens devices, sputtered substance is likely to stay, and the space has an environment where the electrode body or the insulating member supporting the electrode body is likely to be contaminated.

In the present embodiment, a gas exhaust port is provided in the cover electrode of the electrostatic quadrupole lens device. In this manner, the sputtered substance can be easily exhausted outward of the cover electrode through the gas exhaust port. In addition, since the gas exhaust port is provided, a degree of vacuum in the space between the upstream side cover electrode and the downstream side cover electrode of each of the electrostatic quadrupole lens devices, that is, a degree of vacuum of the beamline of the high frequency linear acceleration unit is increased. The multiply charged ions may be used to generate the higher energy ion beam, in some cases. When the multiply charged ions interact with gas remaining in the beamline, the multiply charged ions have a property in which a charge state decreases. In particular, as the charge state of the multiply charged ions increases, the multiply charged ions tend to interact with residual gas. According to the present embodiment, the gas exhaust port is provided in the cover electrode. In this manner, the residual gas in the beamline can be decreased, and it is possible to suppress a decrease in a beam current which is caused by a decrease in the multiply charged ions.

FIG. 1 is a top view schematically illustrating an ion implanter 100 according to an embodiment. The ion implanter 100 includes a beam generation unit 12, a beam acceleration unit 14, a beam deflection unit 16, a beam transport unit 18, and a substrate transferring/processing unit 20.

The beam generation unit 12 has an ion source 10 and a mass analyzer 11. In the beam generation unit 12, the ion beam is extracted from the ion source 10, and the extracted ion beam is subjected to mass analysis by the mass analyzer 11. The mass analyzer 11 has a mass analyzing magnet 11a and a mass resolving slit 11b. The mass resolving slit 11b is disposed on a downstream side of the mass analyzing magnet 11a. As a result of the mass analysis performed by the mass analyzer 11, only an ion species required for implantation is selected, and the ion beam of the selected ion species is guided to the subsequent beam acceleration unit 14.

The beam acceleration unit 14 has a plurality of linear acceleration units 22a, 22b, and 22c for accelerating the ion beam and a beam measurement unit 23, and forms a linearly extending portion of a beamline BL. Each of the plurality of linear acceleration units 22a to 22c includes one or more high frequency accelerators respectively in one or more stages, and causes a radio frequency (RF) electric field to act on and to accelerate the ion beam. The beam measurement unit 23 is provided most downstream of the beam acceleration unit 14, and measures at least one beam characteristic of the high energy ion beam accelerated by the plurality of linear acceleration units 22a to 22c. The beam measurement unit 23 measures beam energy, a beam current, a beam profile, or the like as the beam characteristic of the ion beam. In the present specification, the beam acceleration unit 14 is also referred to as a "high energy multistage linear acceleration unit".

In the present embodiment, three linear acceleration units 22a to 22c are provided. The first linear acceleration unit 22a is provided in an upper stage of the beam acceleration unit 14, and includes the high frequency accelerators respectively in a plurality of stages (for example, 5 to 15 stages). The first linear acceleration unit 22a performs "bunching" of a continuous beam (DC beam) output from the beam generation unit 12 to match a specific acceleration phase, and accelerates the ion beam to have the energy of approximately 1 MeV, for example. The second linear acceleration unit 22b is provided in a middle stage of the beam acceleration unit 14, and includes the high frequency accelerators respectively in a plurality of stages (for example, 5 to 15 stages). The second linear acceleration unit 22b accelerates the ion beam output from the first linear acceleration unit 22a to have the energy of approximately 2 to 3 MeV, for example. The third linear acceleration unit 22c is provided in the lower stage of the beam acceleration unit 14, and includes the high frequency accelerators respectively in a plurality of stages (for example, 5 to 15 stages). The third linear acceleration unit 22c accelerates the ion beam output from the second linear acceleration unit 22b to have the high energy of 4 MeV or higher, for example.

The high energy ion beam output from the beam acceleration unit 14 has an energy distribution in a certain range. Therefore, in order that the high energy ion beam is scanned and parallelized downstream of the beam acceleration unit 14 to irradiate the wafer, highly accurate energy analysis, energy distribution control, trajectory correction, and beam convergence/divergence adjustment need to be performed in advance.

The beam deflection unit 16 performs energy analysis, energy distribution control, and trajectory correction of the high energy ion beam output from the beam acceleration unit 14. The beam deflection unit 16 forms a portion extending in an arc shape in the beamline BL. A direction of the high energy ion beam is changed toward the beam transport unit 18 by the beam deflection unit 16.

The beam deflection unit 16 includes an energy analysis electromagnet 24, a horizontally focusing quadrupole lens 26 that suppresses energy distribution, an energy resolving slit 27, a first Faraday cup 28, a deflection electromagnet 30 that provides beam steering (trajectory correction), and a second Faraday cup 31. The energy analysis electromagnet 24 is referred to as an energy filter electromagnet (EFM). In addition, a device group including the energy analysis electromagnet 24, the horizontally focusing quadrupole lens 26, the energy resolving slit 27, and the first Faraday cup 28 is collectively referred to as an "energy analysis device".

The energy resolving slit 27 may be configured so that a slit width is variable to adjust resolution of the energy analysis. For example, the energy resolving slit 27 may be configured to include two blocking bodies that are movable in a slit width direction, and may be configured so that the slit width is adjustable by changing an interval between the two blocking bodies. The energy resolving slit 27 may be configured so that the slit width is variable by selecting any one of a plurality of slits having different slit widths.

The first Faraday cup 28 is disposed immediately after the energy resolving slit 27, and is used in measuring the beam current for the energy analysis. The second Faraday cup 31 is disposed immediately after the deflection electromagnet 30, and is provided to measure the beam current of the ion beam which enters the beam transport unit 18 after a beam trajectory correction. Each of the first Faraday cup 28 and the second Faraday cup 31 is configured to be movable into and out of the beamline BL by an operation of a Faraday cup drive unit (not illustrated).

The beam transport unit 18 forms the other linearly extending portion of the beamline BL, and is parallel to the beam acceleration unit 14 while a maintenance area MA in the center of the ion implanter 100 is interposed therebetween. A length of the beam transport unit 18 is designed to be approximately the same as a length of the beam acceleration unit 14. As a result, the beamline BL including the beam acceleration unit 14, the beam deflection unit 16, and the beam transport unit 18 forms a U-shaped layout as a whole.

The beam transport unit 18 includes a beam shaper 32, a beam scanner 34, a beam dump 35, a beam parallelizer 36, a final energy filter 38, and left and right Faraday cups 39L and 39R.

The beam shaper 32 includes a focusing/defocusing lens such as a quadrupole lens device (Q lens), and is configured to shape the ion beam having passed through the beam deflection unit 16 into a desired cross-sectional shape. For example, the beam shaper 32 is configured to include an electric field type three-stage quadrupole lens (also referred to as a triplet Q lens), and has three electrostatic quadrupole lens devices. The beam shaper 32 can independently adjust convergence or divergence of the ion beam in each of a horizontal direction (x-direction) and a vertical direction (y-direction) by using the three lens devices. The beam shaper 32 may include a magnetic field type lens device, or may include both an electric field and a magnetic field type lens device.

The beam scanner 34 is a beam deflection device configured to provide reciprocating scanning with the beam and to perform scanning in the x-direction with the shaped ion beam. The beam scanner 34 has a scanning electrode pair facing in a beam scanning direction (x-direction). The scanning electrode pair is connected to variable voltage power supplies (not illustrated), and a voltage applied between the scanning electrode pair is periodically changed. In this manner, an electric field generated between the electrodes is changed so that the ion beam is deflected at various angles. As a result, the scanning with the ion beam is performed over a scanning range indicated by an arrow X. In FIG. 1, a plurality of trajectories of the ion beam in the scanning range are indicated by fine solid lines. The beam scanner 34 may be replaced with another beam scan unit, and the beam scan unit may be configured to serve as an electromagnet device using the magnetic field.

The beam scanner 34 deflects the beam beyond the scanning range indicated by the arrow X. In this manner, the ion beam is incident into the beam dump 35 provided at a position away from the beamline BL. The beam scanner 34 causes the ion beam to temporarily retreat from the beamline BL toward the beam dump 35, thereby blocking the ion beam so that the ion beam does not reach the substrate transferring/processing unit 20 located downstream of the beamline BL.

The beam parallelizer 36 is configured so that the traveling direction of the ion beam used for the scanning is parallel to a trajectory of the designed beamline BL. The beam parallelizer 36 has a plurality of arc-shaped parallelizing lens electrodes in a central portion of each of which a passing slit for the ion beam is provided. The parallelizing lens electrodes are connected to high-voltage power supplies (not illustrated), and apply the electric field generated by voltage application to the ion beam so that the traveling directions of the ion beam are parallelized. The beam parallelizer 36 may be replaced with another beam parallelizing device, and the another beam parallelizing device may be configured to serve as an electromagnet device using the magnetic field.

The final energy filter 38 is configured to analyze the energy of the ion beam and deflect the ions having the required energy downward (in the −y-direction) so that the ions are guided to the substrate transferring/processing unit 20. The final energy filter 38 is referred to as an angular energy filter (AEF), and has an AEF electrode pair for electric field deflection. The AEF electrode pair is connected to high-voltage power supplies (not illustrated). The ion beam is deflected downward by applying a positive voltage to an upper AEF electrode and applying a negative voltage to a lower AEF electrode. The final energy filter 38 may be configured to include an electromagnet device for magnetic field deflection, or may be configured to include both the AEF electrode pair for electric field deflection and the electromagnet device for magnetic field deflection.

The left and right Faraday cups 39L and 39R are provided on the downstream side of the final energy filter 38, and are disposed at positions into which the left and right end beams in the scanning range indicated by the arrow X can be incident. The left and right Faraday cups 39L and 39R are provided at positions that do not block the beam toward the wafer W, and measure the beam current into the wafer W during ion implantation.

The substrate transferring/processing unit 20 is provided on the downstream side of the beam transport unit 18, that is, on the most downstream side of the beamline BL. The substrate transferring/processing unit 20 includes an implantation processing chamber 40, a beam monitor 41, a beam profiler 42, a profiler driving device 43, a substrate transfer device 44, and a load port 46. The implantation processing chamber 40 is provided with a platen driving device (not illustrated) that holds the wafer W during the ion implantation and moves the wafer W in a direction (y-direction) perpendicular to the beam scanning direction (x-direction).

The beam monitor 41 is provided on the most downstream side of the beamline BL inside the implantation processing chamber 40. The beam monitor 41 is provided at a position into which the ion beam can be incident when the wafer W does not exist on the beamline BL, and is configured to measure the beam characteristics before or between the ion implantation processes. The beam monitor 41 measures the beam current, the beam parallelism, or the like as the beam characteristic. For example, the beam monitor 41 is located close to a transfer port (not illustrated) connecting the implantation processing chamber 40 and the substrate transfer t device 44, and is provided at a position vertically below the transfer port.

The beam profiler 42 is configured to measure the beam current at a position on the surface of the wafer W. The beam profiler 42 is configured to be movable in the x-direction by an operation of the profiler driving device 43, is retreated from an implantation position where the wafer W is located during the ion implantation, and is inserted into the implantation position when the wafer W is not located at the implantation position. The beam profiler 42 measures the beam current while moving in the x-direction. In this manner, the beam profiler 42 can measure the beam current over the entire beam scanning range in the x-direction. In the beam profiler 42, a plurality of Faraday cups may be aligned in an array in the x-direction so that the beam currents can simultaneously be measured at a plurality of positions in the beam scanning direction (x-direction).

The beam profiler 42 may include a single Faraday cup for measuring the beam current, or may include an angle measurement device for measuring angle information of the beam. For example, the angle measurement device includes a slit and a plurality of current detectors provided away from the slit in the beam traveling direction (z-direction). For example, the angle measurement device can measure angle components of the beam in the slit width direction by causing the plurality of current detectors aligned in the slit width direction to measure the beam having passed through the slit. The beam profiler 42 may include a first angle measurement device capable of measuring the angle information in the x-direction and a second angle measurement device capable of measuring the angle information in the y-direction.

The substrate transfer device 44 is configured to transfer the wafer W between the load port 46 on which a wafer container 45 is placed and the implantation processing chamber 40. The load port 46 is configured so that a plurality of the wafer containers 45 can be placed at the same time, and for example, has four placement tables aligned in the x-direction. A wafer container transfer port (not illustrated) is provided vertically above the load port 46, and is configured so that the wafer container 45 can pass through the wafer container transfer port in the vertical direction. For example, the wafer container 45 is automatically loaded onto the load port 46 through the wafer container transfer port by a transfer robot installed on a ceiling in a semiconductor manufacturing factory where the ion implanter 100 is installed, and is automatically unloaded from the load port 46.

The ion implanter 100 further includes a central control device 50. The central control device 50 controls an overall operation of the ion implanter 100. The central control device 50 is realized by an element or a machine device such as a computer CPU or a memory in terms of hardware, and is realized by a computer program or the like in terms of software. Various functions provided by the central control device 50 can be realized in cooperation between the hardware and the software.

An operation panel 49 having a display unit and an input device for setting operation parameters of the ion implanter 100 is provided in the vicinity of the central control device 50. The positions of the operation panel 49 and the central control device 50 are not particularly limited. For example, the operation panel 49 and the central control device 50 can be disposed adjacent to an entrance/exit 48 of the maintenance area MA between the beam generation unit 12 and the substrate transferring/processing unit 20. Work efficiency can be improved by adjoining locations of the ion source 10, the load port 46, the operation panel 49, and the central control device 50 which are frequently operated by an operator who manages the ion implanter 100.

Figure 2A:
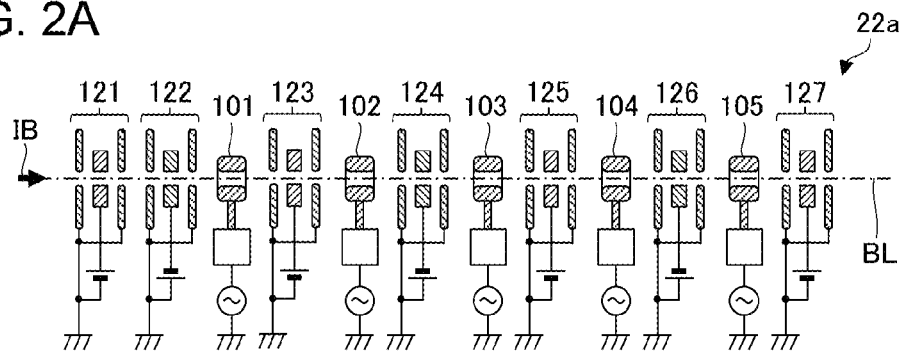
FIGS. 2A to 2C are sectional views illustrating a schematic configuration of a linear acceleration unit.
Figure 2B:
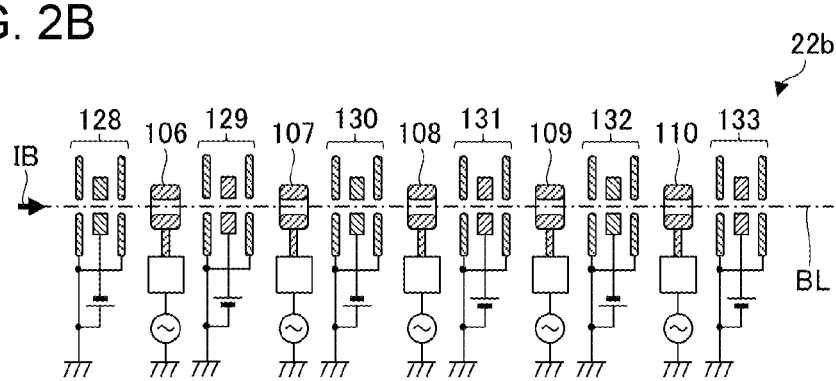
Figure 2C:
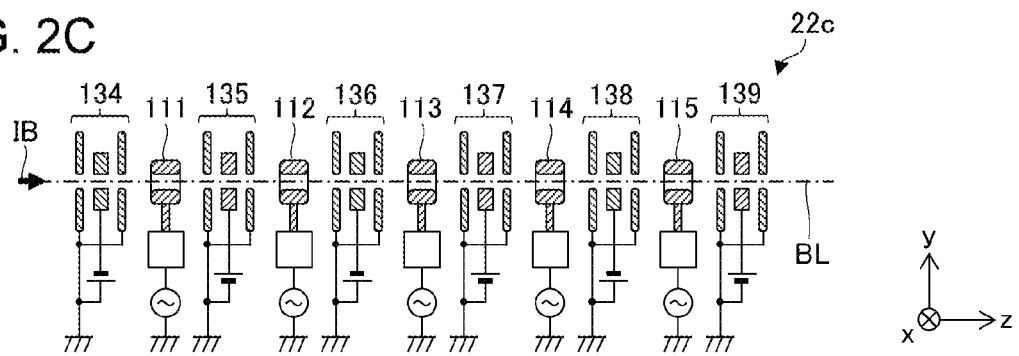

Subsequently, a configuration of the beam acceleration unit 14 will be described in detail. FIGS. 2A to 2C are sectional views illustrating each configuration of the linear acceleration units 22a to 22c. FIG. 2A illustrates a configuration of the first linear acceleration unit 22a, FIG. 2B illustrates a configuration of the second linear acceleration unit 22b, and FIG. 2C illustrates a configuration of the third linear acceleration unit 22c. The linear acceleration units 22a to 22c include high frequency accelerators 101 to 115 respectively in a plurality of stages disposed along the beamline BL and electrostatic quadrupole lens devices 121 to 139 respectively in a plurality of stages disposed along the beamline BL. At least one electrostatic quadrupole lens device is disposed in each of the upstream side and the downstream side of the high frequency accelerators 101 to 115 respectively in the plurality of stages.

The high frequency accelerator accelerates or decelerates the ion particles forming the ion beam IB by applying a high frequency voltage $V_{RF}$ to a high frequency electrode through which the ion beam IB passes. The high frequency accelerator in each of the stages is configured so that a voltage amplitude $V_0$, a frequency f, and a phase φ of the high frequency voltage $V_{RF}$ can individually be adjusted. In the present specification, the voltage amplitude $V_0$, the frequency f, and the phase φ of the high frequency voltage $V_{RF}$ are collectively referred to as "high frequency parameters".

The electrostatic quadrupole lens device includes lens electrodes for causing an electrostatic field to act on the ion beam IB to focus or defocus the ion beam IB, and ground electrodes provided on the upstream side and the downstream side of the lens electrodes. The electrostatic quadrupole lens device functions as a horizontally focusing (vertically defocus) lens that causes the beam to converge in the x-direction, or a vertically focusing (horizontally defocusing) lens that causes the beam to converge in the y-direction by switching positive and negative voltages applied to the lens electrodes.

In FIGS. 2A to 2C, the lens electrodes facing in the y-direction are illustrated, and the lens electrodes facing in the x-direction are omitted. When the negative voltage is applied to the lens electrodes facing in the y-direction, the electrostatic quadrupole lens device functions as the horizontally focusing (vertically defocusing) lens. On the other hand, when the positive voltage is applied to the lens electrodes facing in the y-direction, the electrostatic quadrupole lens device functions as the vertically focusing (horizontally defocusing) lens. Configurations of the lens electrodes will be described later with reference to FIGS. 3A and 3B.

The first linear acceleration unit 22a includes high frequency accelerators 101, 102, 103, 104, and 105 in five stages and electrostatic quadrupole lens devices 121, 122, 123, 124, 125, 126, and 127 in seven stages. The electrostatic quadrupole lens devices 121 and 122 in the first stage and the second stage are continuously disposed in an inlet of the first linear acceleration unit 22a. Each of the electrostatic quadrupole lens devices 123 to 127 from the third stage to the seventh stage excluding the first stage and the second stage is disposed on the downstream side of each of the high frequency accelerators 101 to 105 from the first stage to the fifth stage.

The electrostatic quadrupole lens devices 121 to 127 in seven stages provided in the first linear acceleration unit 22a are disposed so that the horizontally focusing lens and the vertically focusing convergence lens are alternately disposed along the beamline BL. For example, the electrostatic quadrupole lens devices 121, 123, 125, and 127 in the first stage, the third stage, the fifth stage, and the seventh stage are the vertically focusing lenses, and the electrostatic quadrupole lens devices 122, 124, and 126 in the second stage, the fourth stage, and the sixth stage are the horizontally focusing lenses.

The second linear acceleration unit 22b includes high frequency accelerators 106, 107, 108, 109, and 110 in five stages and electrostatic quadrupole lens devices 128, 129, 130, 131, 132, and 133 in six stages. Each of the electrostatic quadrupole lens devices 129 to 133 from the ninth stage to the thirteenth stage excluding the electrostatic quadrupole lens device 128 in the eighth stage provided in an inlet of the second linear acceleration unit 22b is disposed on the downstream side of each of the high frequency accelerators 106 to 110 from the sixth stage to the tenth stage. The electrostatic quadrupole lens devices 128 to 133 in six stages provided in the second linear acceleration unit 22b are disposed so that the horizontally focusing lens and the vertically focusing lens are alternately disposed along the beamline BL. For example, the electrostatic quadrupole lens devices 128, 130, and 132 in the eighth stage, the tenth stage, and the twelfth stages are the horizontally focusing lenses, and the electrostatic quadrupole lens devices 129, 131, and 133 in the ninth stage, the eleventh stage, and the thirteenth stage are the vertically focusing lenses.

The third linear acceleration unit 22c includes high frequency accelerators 111, 112, 113, 114, and 115 in five stages and electrostatic quadrupole lens devices 134, 135, 136, 137, 138, and 139 in six stages. Each of the electrostatic quadrupole lens devices 135 to 139 from the fifteenth stage to the nineteenth stage excluding the electrostatic quadrupole lens device 134 in the fourteenth stage provided in an inlet of the third linear acceleration unit 22c is disposed on the downstream side of each of the high frequency accelerators 111 to 115 from the eleventh stage to the fifteenth stage. The electrostatic quadrupole lens devices 134 to 139 in six stages provided in the third linear acceleration unit 22c are disposed so that the horizontally focusing lens and the vertically focusing lens are alternately disposed along the beamline BL. For example, the electrostatic quadrupole lens devices 134, 136, and 138 in the fourteenth stage, the sixteenth stage, and the eighteenth stage are the horizontally focusing lenses, and the electrostatic quadrupole lens devices 135, 137, and 139 in the fifteenth stage, the seventeenth stage, and the nineteenth stage are the vertically focusing lenses.

The number of stages of the high frequency accelerators and the electrostatic quadrupole lens devices which are included in the linear acceleration units 22a to 22c is not limited to that in the illustrated example, and a configuration may be adopted to have the number of stages different from that in the illustrated example. In addition, the disposition of the electrostatic quadrupole lens devices may be different from that in the illustrated example. For example, the electrostatic quadrupole lens device in at least one stage may have one pair of the horizontally focusing lens and the vertically focusing lens, or may have a plurality of pairs of the horizontally focusing lens and the vertically focusing lens.

Figure 3A:
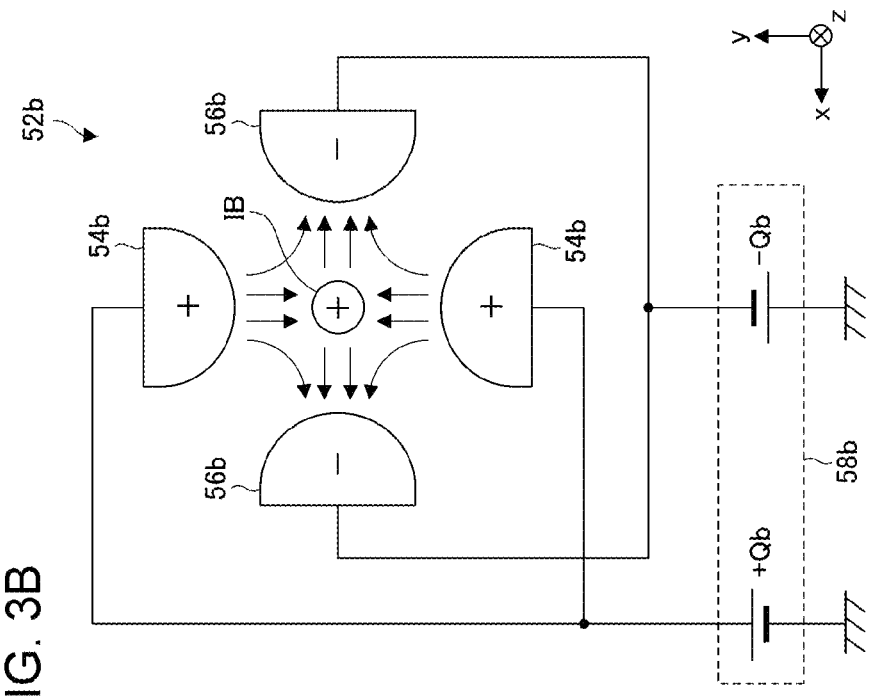
FIGS. 3A and 3B are front views illustrating schematic configurations of an electrostatic quadrupole lens devices.
Figure 3B:
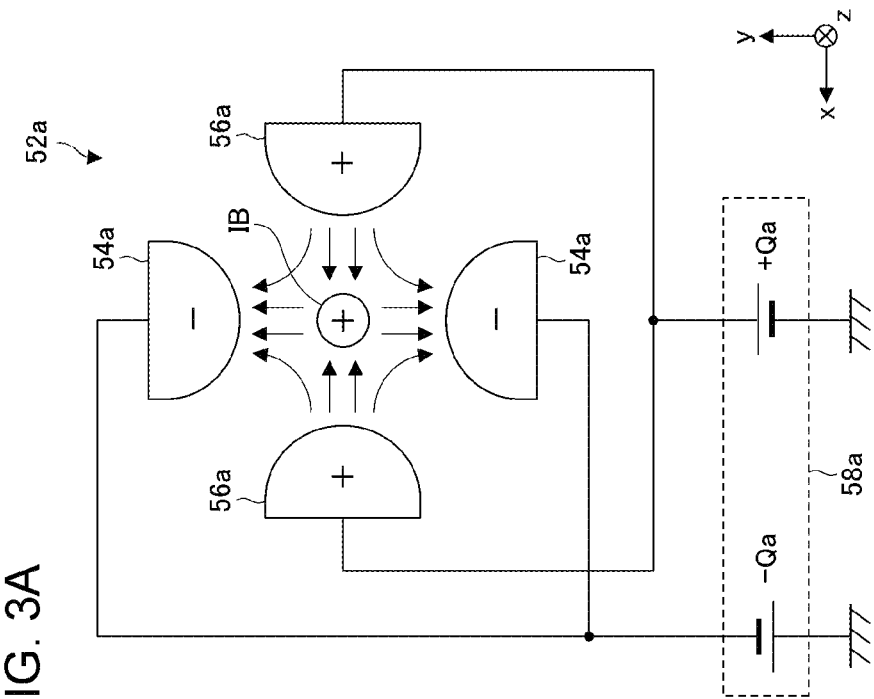

FIGS. 3A and 3B are front views illustrating schematic configurations of the electrostatic quadrupole lens devices 52a and 52b when viewed from the upstream side of the beamline. The electrostatic quadrupole lens device 52a in FIG. 3A is the horizontally focusing lens that causes the ion beam IB to converge in a horizontal direction (x-direction), and the electrostatic quadrupole lens device 52b in FIG. 3B is the vertically focusing lens that causes the ion beam IB to converge in a vertical direction (y-direction).

The electrostatic quadrupole lens device 52a in FIG. 3A has a pair of upper and lower lens electrodes 54a facing in the vertical direction (y-direction) and a pair of left and right lens electrodes 56a facing in the horizontal direction (x-direction). A negative potential −Qa is applied to the upper and lower lens electrodes 54a, and a positive potential +Qa is applied to the left and right lens electrodes 56a. With respect to the ion beam IB formed of positively charged ion particles, the electrostatic quadrupole lens device 52a generates an attractive force between the upper and lower lens electrodes 54a having the negative potential, and generates a repulsive force between the left and right lens electrodes 56a having the positive potential. In this manner, the electrostatic quadrupole lens device 52a causes the ion beam IB to converge in the x-direction and to diverge in the y-direction and adjusts a beam shape.

As in FIG. 3A, the electrostatic quadrupole lens device 52b in FIG. 3B has a pair of upper and lower lens electrodes 54b facing in the vertical direction (y-direction) and a pair of left and right lens electrodes 56b facing in the horizontal direction (x-direction). In FIG. 3B, applied positive and negative potentials are opposite to those in FIG. 3A, a positive potential +Qb is applied to the upper and lower lens electrodes 54b, and a negative potential −Qb is applied to the left and right lens electrodes 56b. As a result, the electrostatic quadrupole lens device 52b causes the ion beam IB to converge in the y-direction and to diverge in the x-direction and adjusts the beam shape.

Figure 4:
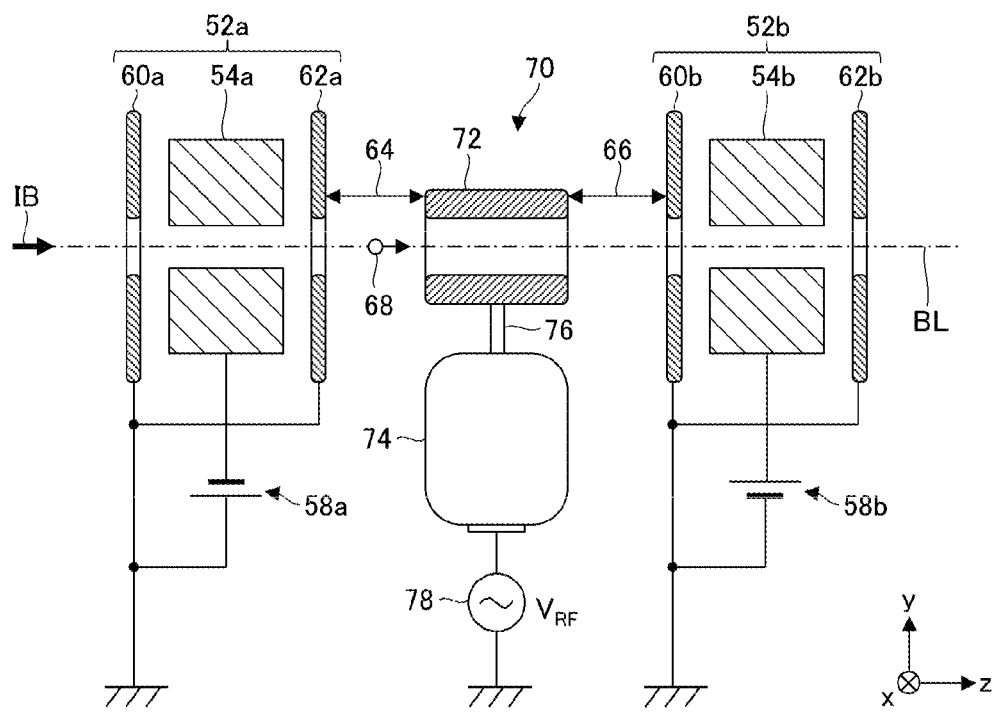
FIG. 4 is a sectional view illustrating a schematic configuration of a high frequency accelerator.

FIG. 4 is a sectional view illustrating a schematic configuration of the high frequency accelerator 70, and illustrates a configuration of the high frequency accelerator corresponding to one stage included in each of the linear acceleration units 22a to 22c. The high frequency accelerator 70 includes a high frequency electrode 72, a high frequency resonator 74, a stem 76, and a high frequency power supply 78. The high frequency electrode 72 has a hollow cylindrical electrode body, and the ion beam IB passes through the inside of the electrode body. The high frequency electrode 72 is connected to the high frequency resonator 74 via the stem 76. The high frequency power supply 78 supplies the high frequency voltage $V_{RF}$ to the high frequency resonator 74. The central control device 50 controls the high frequency resonator 74 and the high frequency power supply 78 to adjust the voltage amplitude $V_0$, the frequency f, and the phase φ of the high frequency voltage $V_{RF}$ applied to the high frequency electrode 72.

The electrostatic quadrupole lens devices 52a and 52b are provided on the upstream side and the downstream side of the high frequency accelerator 70. The electrostatic quadrupole lens device 52a on the upstream side has a first ground electrode 60a, a second ground electrode 62a, upper and lower lens electrodes 54a, left and right lens electrodes 56a, and a lens power supply 58a (refer to FIG. 3). The upper and lower lens electrodes 54a and the left and right lens electrodes 56a are provided between the first ground electrode 60a and the second ground electrode 62a. The electrostatic quadrupole lens device 52b on the downstream side has a first ground electrode 60b, a second ground electrode 62b, upper and lower lens electrodes 54b, left and right lens electrodes 56b, and a lens power supply 58b (refer to FIG. 3). The upper and lower lens electrodes 54b and the left and right lens electrodes 56b are provided between the first ground electrode 60b and the second ground electrode 62b.

In an example in FIG. 4, the electrostatic quadrupole lens device 52a on the upstream side is the horizontally focusing (vertically defocusing) lens, and the electrostatic quadrupole lens device 52b on the downstream side is the vertically focusing (horizontally defocusing) lens. The electrostatic quadrupole lens device 52a on the upstream side may be the vertically focusing (horizontally defocusing) lens, and the electrostatic quadrupole lens device 52b on the downstream side may be the horizontally focusing (vertically defocusing) lens, depending on which shape the high frequency accelerator 70 is located in. The horizontally focusing and the vertically focusing can be changed by inverting the positive and negative voltages applied by the lens power supplies 58a and 58b.

The high frequency accelerator 70 in FIG. 4 accelerates or decelerates ion particle 68 forming the ion beam IB by using potential differences in an upstream side gap 64 between the second ground electrode 62a and the high frequency electrode 72 on the upstream side, and in a downstream side gap 66 between the high frequency electrode 72 and the first ground electrode 60b on the downstream side. For example, the ion particle 68 passing through the high frequency accelerator 70 can be accelerated by adjusting the phase φ of the high frequency voltage $V_{RF}$ so that the negative voltage is applied to the high frequency electrode 72 when the ion particle 68 passes through the upstream side gap 64, and the positive voltage is applied to the high frequency electrode 72 when the ion particle 68 passes through the downstream side gap 66. The inside of the high frequency electrode 72 is substantially equipotential. Accordingly, the ion particle 68 is not accelerated or decelerated when passing through the inside of the high frequency electrode 72.

Figure 5:
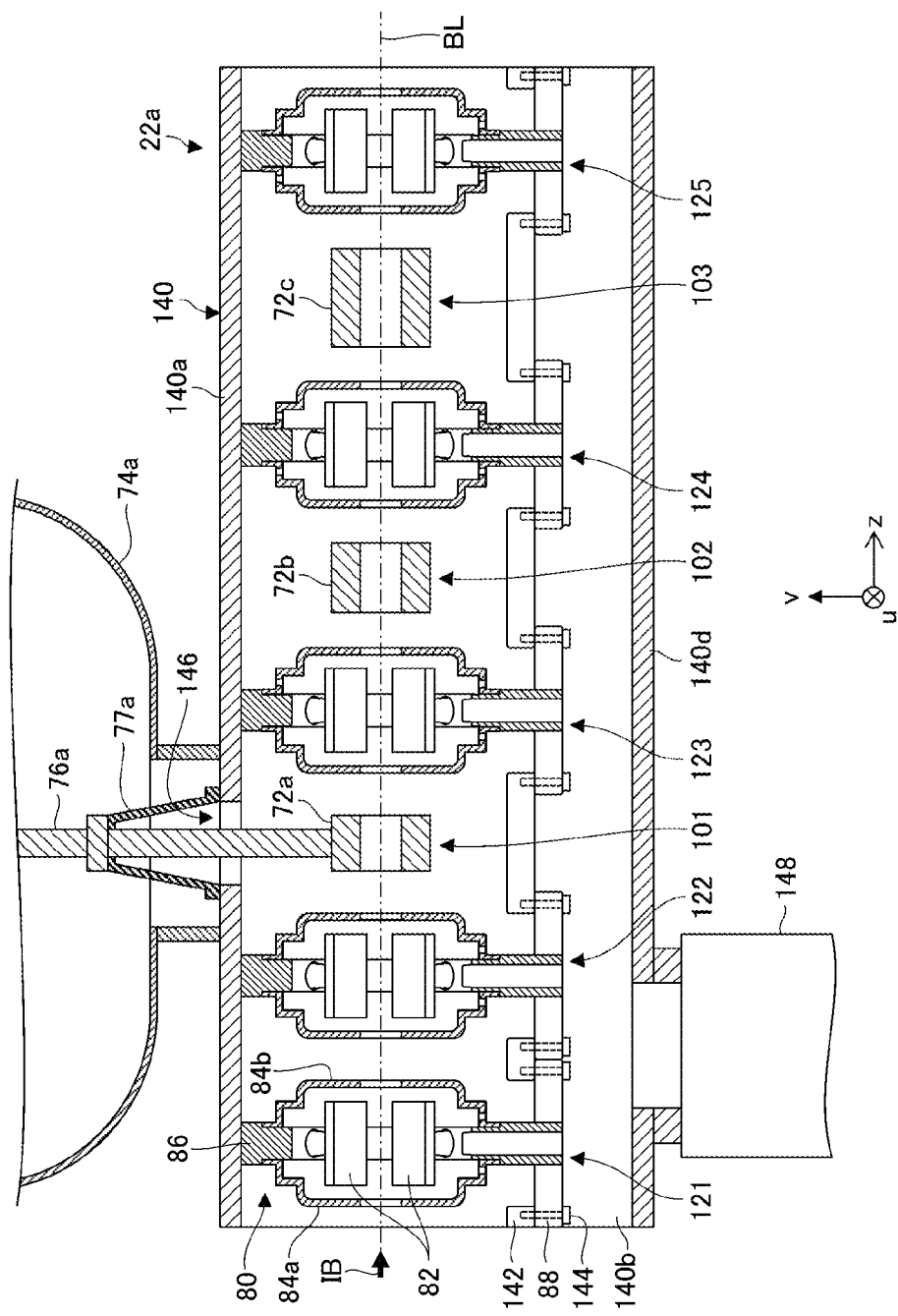
FIG. 5 is a sectional view illustrating details of a configuration of the linear acceleration unit according to an embodiment of the present invention.

FIG. 5 is a sectional view illustrating a detailed configuration of the linear acceleration unit. FIG. 5 illustrates a configuration of the beamline upstream side of the first linear acceleration unit 22a illustrated in FIG. 2A, and illustrates the electrostatic quadrupole lens devices 121 to 125 from the first stage to the fifth stage and the high frequency accelerators 101 to 103 from the first stage to the third stage.

The first linear acceleration unit 22a includes a vacuum chamber 140. The vacuum chamber 140 extends in the z-direction along the beamline BL. The vacuum chamber 140 has a rectangular cross section perpendicular to the beamline BL, and has four partition walls extending in the z-direction. As the four partition walls, the vacuum chamber 140 has an upper wall 140a, a left side wall 140b, a right side wall 140c (refer to FIG. 6 to be described later), and a lower wall 140d.

Figure 6:
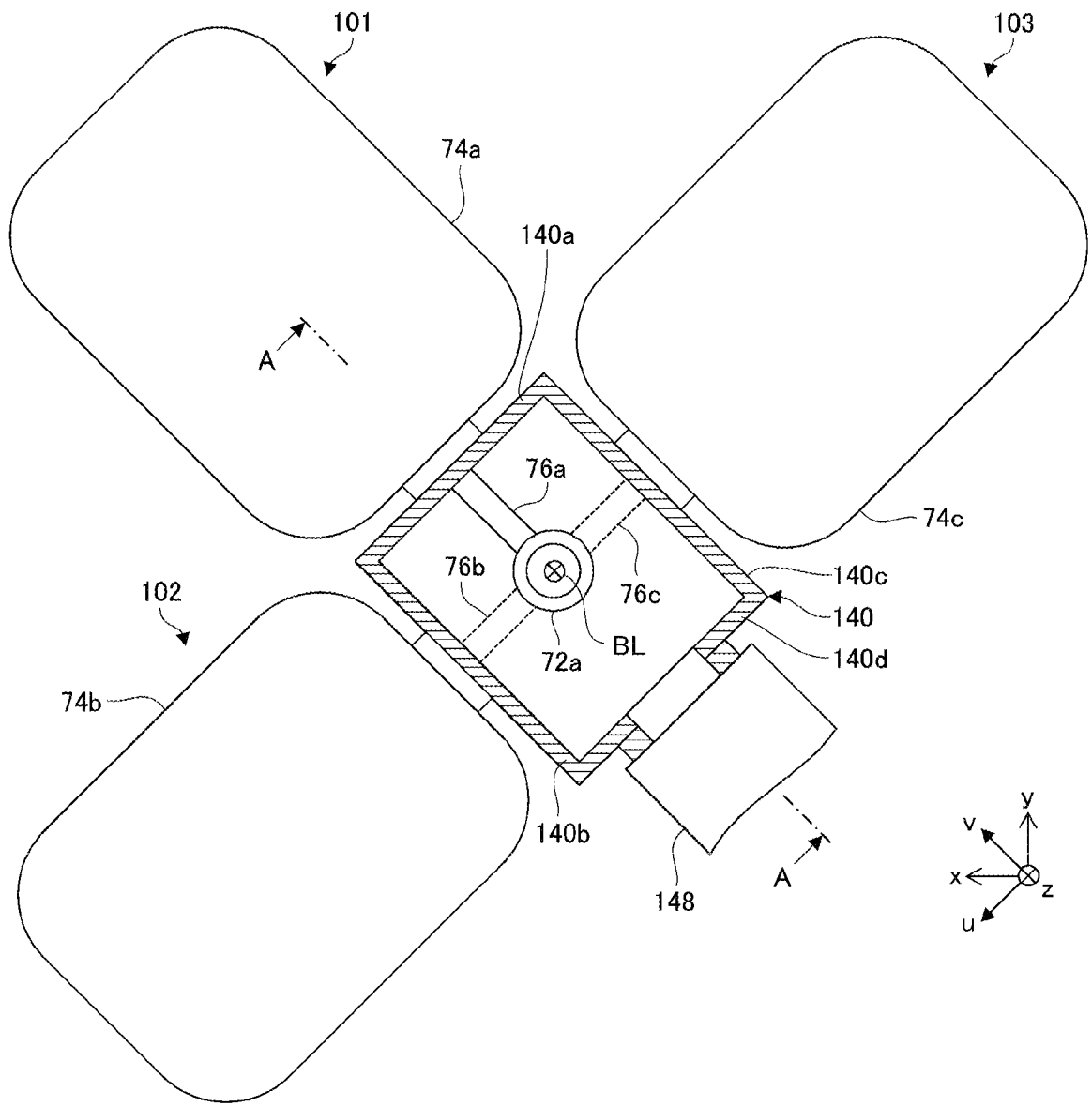
FIG. 6 is a sectional view illustrating a disposition of a vacuum chamber according to the embodiment of the present invention.

FIG. 6 is a sectional view illustrating the disposition of the vacuum chamber 140, and illustrates a cross section perpendicular to the z-axis. FIG. 5 corresponds to a cross section taken along a line A-A in FIG. 6. As illustrated in FIG. 6, the vacuum chamber 140 is disposed in a state rotated around the z-axis by 45 degrees. The upper wall 140a is not disposed on a vertically upper side (+y-direction) and is disposed on an upper left side (+v-direction) when viewed from the beamline BL. The +v-direction corresponds to a direction of a vector obtained by combining unit vectors in the +x-direction and the +y-direction. The left side wall 140b is disposed on a lower left side (+u-direction) when viewed from the beamline BL. The +u-direction corresponds to a direction of a vector obtained by combining unit vectors in the +x-direction and the −y-direction. The right side wall 140c is disposed on an upper right side (−u-direction) when viewed from the beamline BL. The lower wall 140d is disposed on a lower right side (−v-direction) when viewed from the beamline BL.

FIG. 6 further illustrates the disposition of high frequency resonators 74a to 74c included respectively in the high frequency accelerators 101 to 103. The first high frequency resonator 74a included in the high frequency accelerator 101 in the first stage is provided outside the upper wall 140a, and is disposed at a position in the +v-direction when viewed from the beamline BL. The first high frequency resonator 74a is connected to a first high frequency electrode 72a via a first stem 76a extending in the +v-direction when viewed from the beamline BL.

The second high frequency resonator 74b included in the high frequency accelerator 102 in the second stage is provided outside the left side wall 140b, and is disposed at a position in the +u-direction when viewed from the beamline BL. The second high frequency resonator 74b is connected to a second high frequency electrode 72b (refer to FIG. 5) via a second stem 76b extending in the +u-direction when viewed from the beamline BL.

The third high frequency resonator 74c included in the high frequency accelerator 103 in the third stage is provided outside the right side wall 140c, and is disposed at a position in the −u-direction when viewed from the beamline BL. The third high frequency resonator 74c is connected to a third high frequency electrode 72c (refer to FIG. 5) via a third stem 76c extending in the −u-direction when viewed from the beamline BL.

A high frequency resonator is not provided outside the lower wall 140d. The lower wall 140d is provided with a vacuum pump 148 for evacuating the inside of the vacuum chamber 140. The vacuum pump 148 is disposed at a position in the −v-direction when viewed from the beamline BL.

As illustrated in FIG. 6, the vacuum chamber 140 is disposed by being rotated from a horizon by 45 degrees. In this manner, a range occupied by the high frequency resonators 74a to 74c in the x-direction and the y-direction can be reduced, and an overall size of the first linear acceleration unit 22a can be reduced.

In the present specification, a direction in which the beamline BL extends may be referred to as an axial direction. In addition, a direction perpendicular to the axial direction may be referred to as a radial direction, and a direction perpendicular to both the axial direction and the radial direction may be referred to as a circumferential direction. The x-axis, the y-axis, the u-axis, and the v-axis are respectively axes extending in the radial directions in which angles in the circumferential direction are different from each other.

Referring back to FIG. 5, configurations of the high frequency accelerators 101 to 103 will be described. The high frequency accelerator 101 in the first stage includes a first high frequency electrode 72a, a first high frequency resonator 74a, a first stem 76a, and a first insulator 77a. The first stem 76a is inserted into a mounting hole 146 provided on the upper wall 140a. The first insulator 77a is provided outside the vacuum chamber 140 and inside the high frequency resonator 74a. The first insulator 77a is mounted on the upper wall 140a, and supports the first stem 76a. The first insulator 77a is formed in a cone shape, and is provided to cover the mounting hole 146. The first insulator 77a maintains electrical insulation between the vacuum chamber 140 which is the ground potential, and the first stem 76a to which the high frequency voltage $V_{RF}$ is applied. The first insulator 77a is provided at a position in the +v-direction when viewed from the beamline BL.

The high frequency accelerator 102 in the second stage includes a second high frequency electrode 72b, a second high frequency resonator 74b, a second stem 76b, and a second insulator (not illustrated). The high frequency accelerator 102 in the second stage is configured in the same manner as the high frequency accelerator 101 in the first stage. A mounting state is different as illustrated in FIG. 6. Specifically, the second stem 76b is disposed at a position in the +u-direction when viewed from the beamline BL. The second insulator is mounted on the left side wall 140b, and supports the second stem 76b. The second insulator is disposed at a position in the +u-direction when viewed from the beamline BL.

The high frequency accelerator 103 in the third stage includes a third high frequency electrode 72c, a third high frequency resonator 74c, a third stem 76c, and a third insulator (not illustrated). The high frequency accelerator 103 in the third stage is configured in the same manner as the high frequency accelerator 101 in the first stage. The mounting state is different as illustrated in FIG. 6. Specifically, the third stem 76c is disposed at a position in the −u-direction when viewed from the beamline BL. The third insulator is mounted on the right side wall 140c, and supports the third stem 76c. The third insulator is disposed at a position in the −u-direction when viewed from the beamline BL.

The plurality of electrostatic quadrupole lens devices 121 to 125 are provided inside the vacuum chamber 140. Each of the plurality of electrostatic quadrupole lens devices 121 to 125 is configured to serve as a lens unit 80. The lens unit 80 is a unit which includes the electrostatic quadrupole lens device 52a (or 52b) illustrated in FIGS. 3(a), 3(b), and 4. The upper and lower lens electrodes 54a (or 54b), the left and right lens electrodes 56a (or 56b), the first ground electrode 60a (or 60b), and the second ground electrode 62a (or 62b) are integrated with each other. In the present specification, the lens unit 80 is also referred to as the electrostatic quadrupole lens device.

The lens unit 80 includes a plurality of lens electrodes 82, an upstream side cover electrode 84a, a downstream side cover electrode 84b, a base plate 86, and a mounting portion 88.

The plurality of lens electrodes 82 correspond to the upper and lower lens electrodes 54a (or 54b) and the left and right lens electrodes 56a (or 56b) which are illustrated in FIGS. 3A and 3B. The plurality of lens electrodes 82 face each other in the radial direction while the beamline BL is interposed therebetween, and are disposed at an interval in the circumferential direction. Specifically, a pair of the upper and lower lens electrodes face each other in the y-direction, and a pair of the left and right lens electrodes face each other in the x-direction. In addition, the two upper and lower lens electrodes and the two left and right lens electrodes are alternately disposed in the circumferential direction. A positive or negative focusing/defocusing voltage is applied to each of the plurality of lens electrodes 82.

The upstream side cover electrode 84a covers the beamline upstream side of the plurality of lens electrodes 82. The upstream side cover electrode 84a is formed in a bowl shape configured to include only a curved surface or a curved surface and a flat surface. A beam incident port through which the ion beam IB passes is provided in a center of the upstream side cover electrode 84a. The upstream side cover electrode 84a is disposed away from the plurality of lens electrodes 82 in the axial direction or in the radial direction. The upstream side cover electrode 84a is the ground electrode, and corresponds to the first ground electrode 60a (or 60b) in FIG. 4.

The downstream side cover electrode 84b covers the beamline downstream side of the plurality of lens electrodes 82. As in the upstream side cover electrode 84a, the downstream side cover electrode 84b is configured to include only a curved surface, or is formed in a bowl shape configured to include a curved surface and a flat surface. A beam exiting port through which the ion beam IB passes is provided in a center of the downstream side cover electrode 84b. The downstream side cover electrode 84b is disposed away from the plurality of lens electrodes 82 in the axial direction or in the radial direction. The downstream side cover electrode 84*b* is the ground electrode, and corresponds to the second ground electrode 62*a* (or 62*b*) in FIG. 4.

The base plate 86 supports the plurality of lens electrodes 82, the upstream side cover electrode 84*a*, and the downstream side cover electrode 84*b*. The base plate 86 is a plate-shaped member having a thickness in the axial direction. The plurality of lens electrodes 82 are accommodated in a central opening that penetrates a center of the base plate 86. The upstream side cover electrode 84*a* is mounted on the upstream side of the base plate 86. The downstream side cover electrode 84*b* is mounted on the downstream side of the base plate 86.

The mounting portion 88 is a portion fixed to the vacuum chamber 140. The mounting portion 88 is provided in the lower portion of the base plate 86, and extends from the base plate 86 in the axial direction. A mounting bar 142 extending in the axial direction is provided on an inner surface of the vacuum chamber 140. The mounting portion 88 is fixed to the mounting bar 142 by using a fastening member 144 such as a screw or a bolt.

Figure 7:
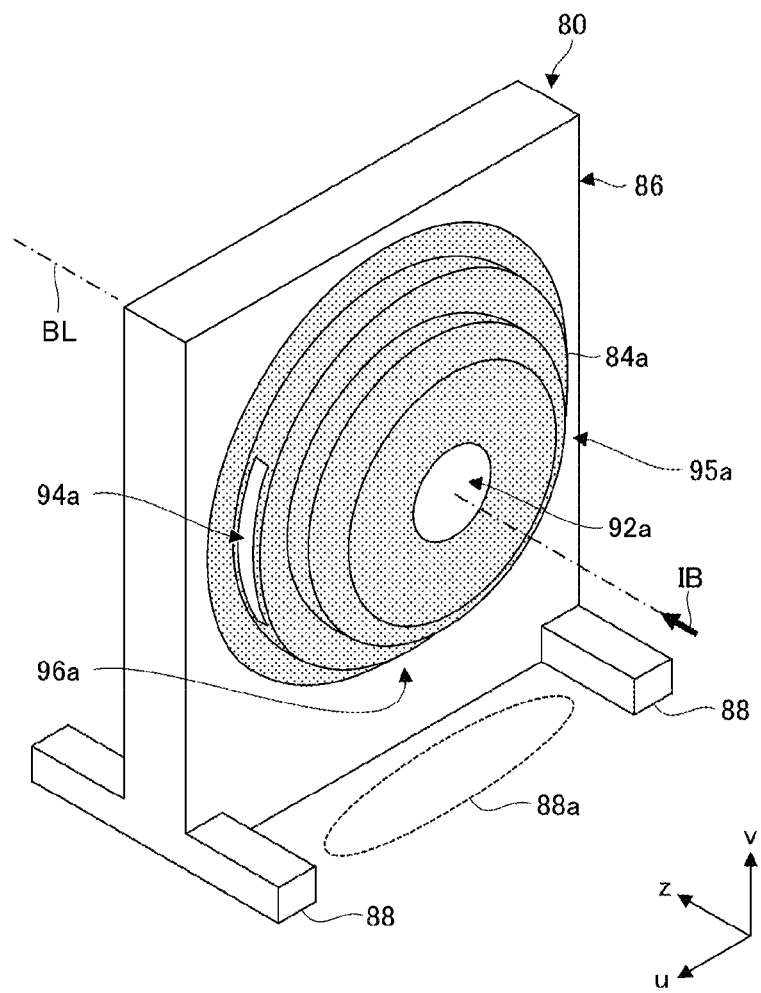
FIG. 7 is an external perspective view illustrating an example of a lens unit when viewed from an upstream side.

FIG. 7 is an external perspective view illustrating an example of the lens unit 80 when viewed from the upstream side. For example, the lens unit 80 in FIG. 7 is the electrostatic quadrupole lens device 122 in the second stage adjacent to the upstream side of the high frequency accelerator 101 in the first stage. The upstream side cover electrode 84*a* has a beam incident port 92*a* through which the ion beam IB passes, and a plurality of gas exhaust ports (also referred to as upstream side gas exhaust ports) 94*a*, 95*a*, and 96*a*. The beam incident port 92*a* is provided in a center of the upstream side cover electrode 84*a*, and is open in the axial direction. The plurality of upstream side gas exhaust ports 94*a* to 96*a* are provided on an outer peripheral portion of the upstream side cover electrode 84*a*, and are open in the radial direction. Each of the plurality of upstream side gas exhaust ports 94*a* to 96*a* is provided to exhaust gas from the inside to the outside of the lens unit 80.

The plurality of upstream side gas exhaust ports 94*a* to 96*a* are respectively provided at different positions in the circumferential direction, and for example, are provided at positions different from each other by 90 degrees in the circumferential direction. For example, the first gas exhaust port 94*a* is provided at a position in the +u-direction when viewed from the beamline BL. The second gas exhaust port 95*a* is provided at a position in the −u-direction when viewed from the beamline BL. The third gas exhaust port 96*a* is provided at a position in the −v-direction when viewed from the beamline BL. In the illustrated example, the gas exhaust port is not provided at a position in the +v-direction when viewed from the beamline BL. A fourth gas exhaust port may be provided at the position in the +v-direction when viewed from the beamline BL.

Each of the plurality of upstream side gas exhaust ports 94*a* to 96*a* is formed as a slit extending in the circumferential direction. For example, each of the plurality of upstream side gas exhaust ports 94*a* to 96*a* is formed as a slit continuously extending over an angle range of approximately 10 degrees to 60 degrees. Each of the plurality of upstream side gas exhaust ports 94*a* to 96*a* may not continuously be formed in the circumferential direction, or may intermittently be formed in the circumferential direction. For example, each of the plurality of upstream side gas exhaust ports 94*a* to 96*a* may be formed as a mesh, or may be formed as a small aperture array.

The mounting portions 88 are provided in both ends of the base plate 86 in a rightward-leftward direction (u-direction), and are not provided near the center of the base plate 86 in the rightward-leftward direction. The mounting portion 88 is formed to have a cutout 88*a* provided on the upstream side. The cutout 88*a* on the upstream side is provided between the beamline BL and the vacuum pump 148. For example, the cutout 88*a* on the upstream side allows the gas flowing toward the vacuum pump 148 from the plurality of upstream side gas exhaust ports 94*a* to 96*a* to pass therethrough. The cutout 88*a* on the upstream side may not continuously be formed, or may be formed as a mesh or a small aperture array.

Figure 8:
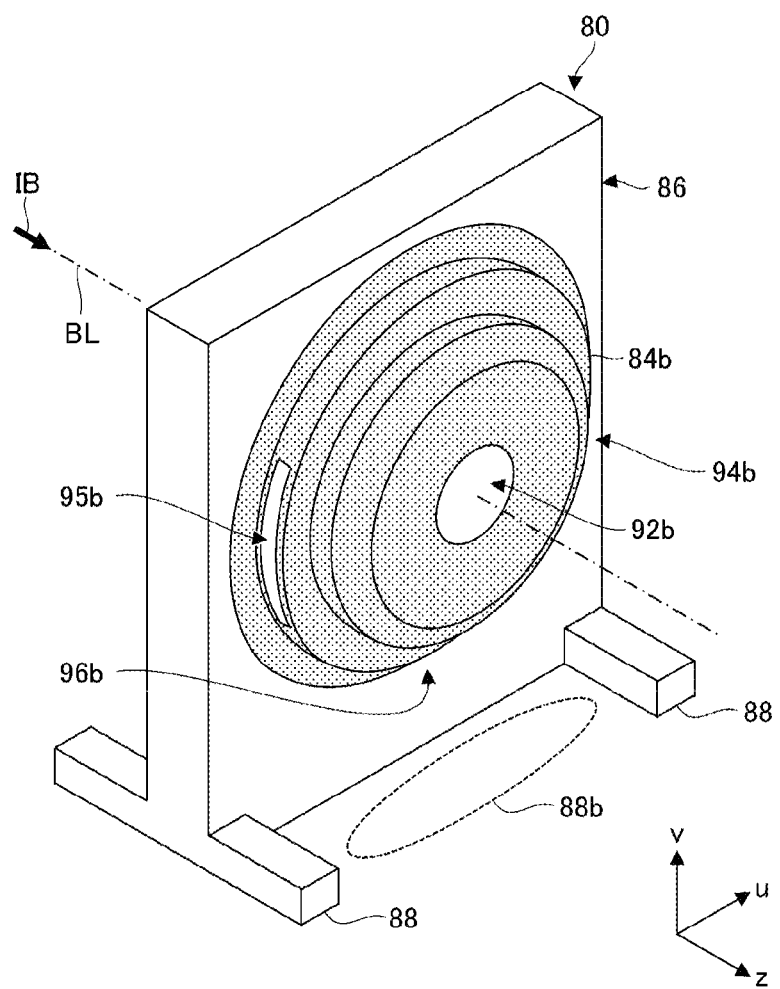
FIG. 8 is an external perspective view illustrating the lens unit in FIG. 7 when viewed from a downstream side.

FIG. 8 is an external perspective view illustrating the lens unit 80 in FIG. 7 when viewed from the downstream side. In the illustrated example, configurations on the upstream side and the downstream side of the lens unit 80 are the same as each other. The downstream side cover electrode 84*b* has a beam exiting port 92*b* through which the ion beam IB passes, and a plurality of gas exhaust ports (also referred to as downstream side gas exhaust ports) 94*b*, 95*b*, and 96*b*. The beam exiting port 92*b* is provided in a center of the downstream side cover electrode 84*b*, and is open in the axial direction. The plurality of downstream side gas exhaust ports 94*b* to 96*b* are provided on an outer peripheral portion of the downstream side cover electrode 84*b*, and are open in the radial direction. For example, the plurality of downstream side gas exhaust ports 94*b* to 96*b* are configured in the same manner as the plurality of upstream side gas exhaust ports 94*a* to 96*a* provided in the upstream side cover electrode 84*a*. Each of the plurality of downstream side gas exhaust ports 94*b* to 96*b* is provided to exhaust the gas from the inside to the outside of the lens unit 80.

As in the upstream side, the mounting portion 88 has a cutout 88*b* provided on the downstream side. The cutout 88*b* on the downstream side is provided between the beamline BL and the vacuum pump 148. For example, the cutout 88*b* on the downstream side allows the gas flowing toward the vacuum pump 148 from the plurality of downstream side gas exhaust ports 94*b* to 96*b* to pass therethrough. The cutout 88*b* on the downstream side may not continuously be formed, or may be formed as a mesh or a small aperture array.

Figure 9:
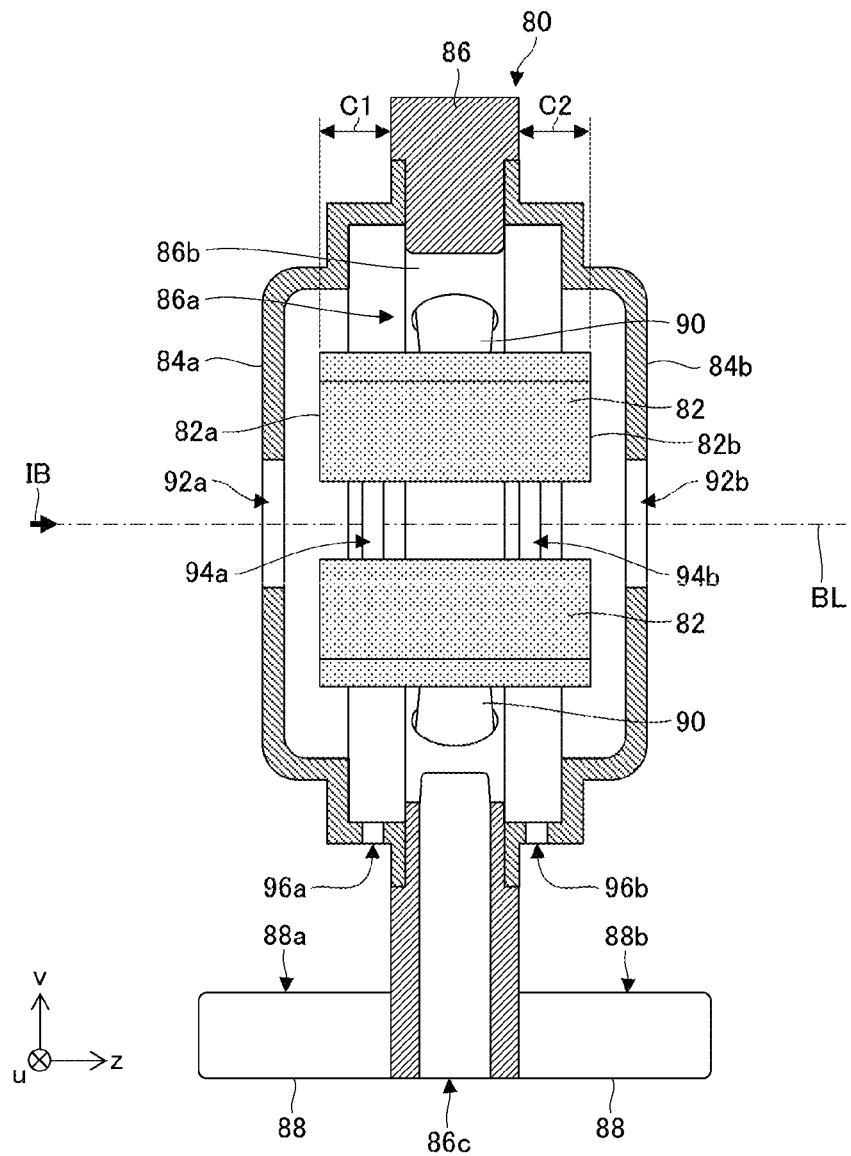
FIG. 9 is a sectional view taken along a beamline, which illustrates a detailed internal configuration of the lens unit in FIG. 7.

FIG. 9 is a sectional view taken along the beamline BL, which illustrates a detailed internal configuration of the lens unit 80 in FIG. 7, and is an enlarged view of the lens unit 80 illustrated in FIG. 5. For example, the lens unit 80 in FIG. 9 is the electrostatic quadrupole lens device 122 in the second stage adjacent to the upstream side of the high frequency accelerator 101 in the first stage. The lens unit 80 includes a plurality of insulating members 90 that respectively support the plurality of lens electrodes 82. For example, the plurality of insulating members 90 are columnar insulators. Each of the plurality of insulating members 90 extends outward in the radial direction from the corresponding lens electrode 82 toward the base plate 86. Each of the plurality of insulating members 90 is mounted on an inner peripheral surface 86*b* of a central opening 86*a* of the base plate 86. A wiring port 86*c* extending in the v-direction is provided in the lower portion of the base plate 86. Wires (not illustrated) for applying high voltages to the plurality of lens electrodes 82 are inserted through the wiring port 86*c*.

The plurality of gas exhaust ports 94*a* to 96*a* and 94*b* to 96*b* provided in the upstream side cover electrode 84*a* and the downstream side cover electrode 84*b* are provided at positions farther away from the beamline BL in the radial direction than the plurality of lens electrodes 82. That is, the plurality of gas exhaust ports 94*a* to 96*a* and 94*b* to 96*b* are provided on rear sides of the plurality of lens electrodes 82 when viewed from the beamline BL. Since the plurality of gas exhaust ports 94a to 96a and 94b to 96b are provided on the rear sides of the plurality of lens electrodes 82, it is possible to adopt a configuration in which spatial distribution of a focusing/defocusing electric field acting on the ion beam IB is substantially not changed. That is, it is possible to prevent a change in focusing/defocusing performance of the lens unit 80 which is caused by the provided gas exhaust ports.

Positions of the plurality of gas exhaust ports 94a to 96a and 94b to 96b in the axial direction are in ranges C1 and C2 between positions of end portions 82a and 82b of the plurality of lens electrodes 82 in the axial direction and positions of the plurality of insulating members 90 in the axial direction. The plurality of upstream side gas exhaust ports 94a to 96a are provided in the range C1 between the upstream side end portion 82a of the plurality of lens electrodes 82 and the plurality of insulating members 90. That is, the plurality of upstream side gas exhaust ports 94a to 96a are provided to avoid positions on the upstream side of the upstream side end portion 82a of the plurality of lens electrodes 82. In this manner, it is possible to prevent a change in the function of the upstream side cover electrode 84a serving as the ground electrode which is caused by the provided gas exhaust ports. In addition, the plurality of downstream side gas exhaust ports 94b to 96b are provided in the range C2 between the downstream side end portion 82b of the plurality of lens electrodes 82 and the plurality of insulating members 90. That is, the plurality of downstream side gas exhaust ports 94b to 96b are provided to avoid positions on the downstream side of the downstream side end portion 82b of the plurality of lens electrodes 82. In this manner, it is possible to prevent a change in the function of the downstream side cover electrode 84b serving as the ground electrode which is caused by the provided gas exhaust ports. In addition, since the plurality of gas exhaust ports 94a to 96a and 94b to 96b are provided to avoid the positions of the plurality of insulating members 90 in the axial direction, a flow of the gas toward the plurality of insulating members 90 can be suppressed, and a possibility that sputter particles may adhere to the plurality of insulating members 90 can be suppressed.

Figure 10:
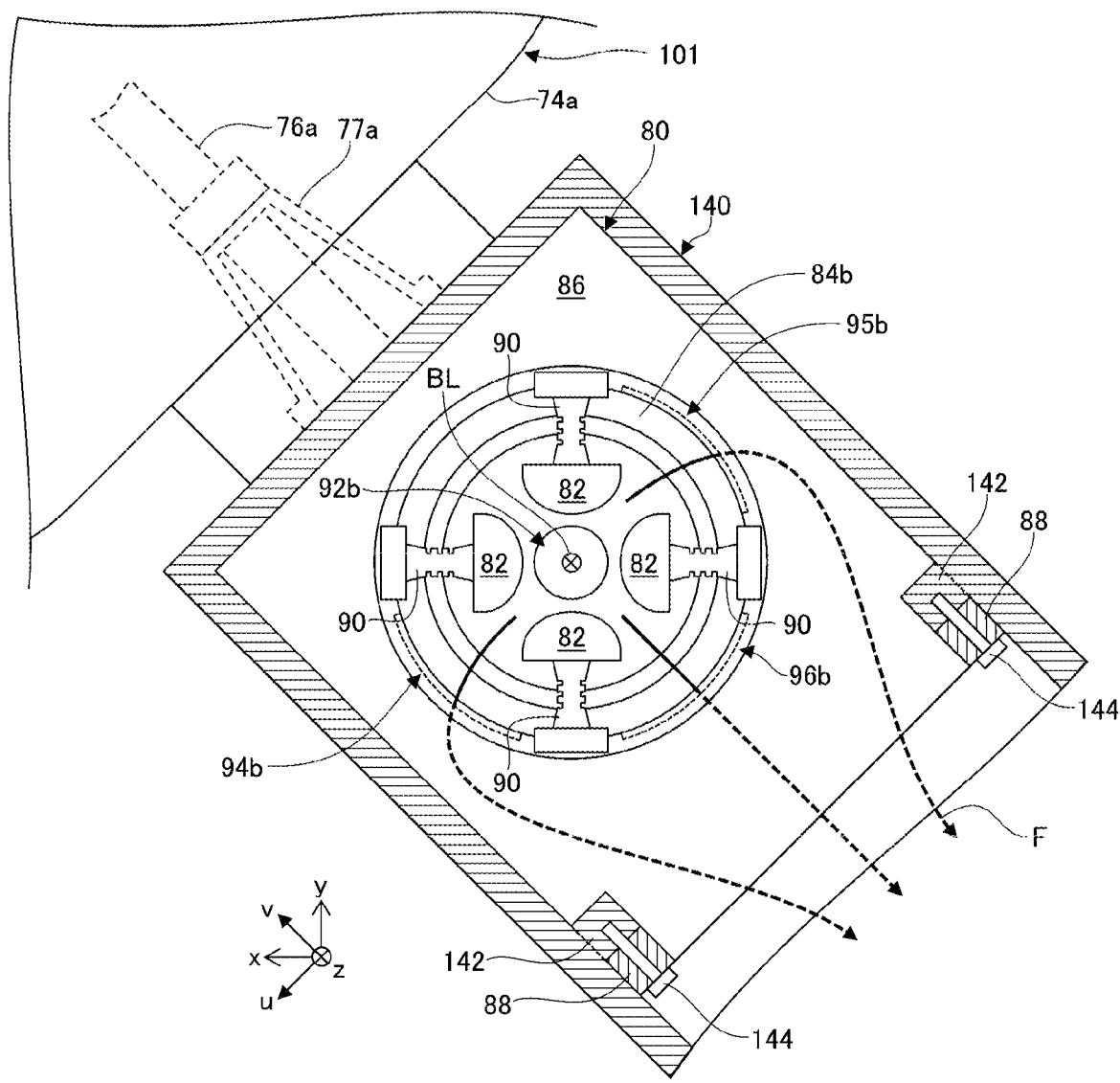
FIG. 10 is a sectional view perpendicular to the beamline, which illustrates a detailed internal configuration of the lens unit in FIG. 7.

FIG. 10 is a sectional view perpendicular to the beamline BL, which illustrates a detailed internal configuration of the lens unit 80 in FIG. 7. FIG. 10 illustrates the lens unit 80 in a state where the upstream side cover electrode 84a is removed when viewed from the beamline upstream side. For example, the lens unit 80 in FIG. 10 is the electrostatic quadrupole lens device 122 in the second stage adjacent to the upstream side of the high frequency accelerator 101 in the first stage.

FIG. 10 illustrates a disposition relationship of the plurality of lens electrodes 82 and the plurality of downstream side gas exhaust ports 94b to 96b in the circumferential direction. As illustrated, each of the plurality of downstream side gas exhaust ports 94b to 96b is disposed to be shifted from the plurality of lens electrodes 82 in the circumferential direction. For example, each of the plurality of downstream side gas exhaust ports 94b to 96b is shifted to be displaced by 45 degrees from each of the plurality of lens electrodes 82. For example, when a direction in which the first stem 76a extends (+v-direction) is 0 degrees, the plurality of lens electrodes 82 are disposed at positions of 45 degrees, 135 degrees, 225 degrees, and 315 degrees. The plurality of downstream side gas exhaust ports 94b to 96b are disposed at positions of 270 degrees, 90 degrees, and 180 degrees. The plurality of upstream side gas exhaust ports 94a to 96a (not illustrated in FIG. 10) are similarly disposed at positions of 270 degrees, 90 degrees, and 180 degrees to correspond to the plurality of downstream side gas exhaust ports 94b to 96b.

In the lens unit 80, when the ion beam IB collides with the electrode body of the lens electrode 82 or the cover electrode 84a or 84b, the electrode body is sputtered, and the substance forming the electrode body is scattered as the sputter particles. The generated sputter particles may adhere to the surface of the electrode body or the insulating member 90 as dirt. The sputter particles are a conductive substance. The sputter particles adhere to the surface of the electrode body and form fine irregularities. AS a result, discharge is likely to occur between the electrodes. For example, the discharge may occur between the lens electrode 82 to which the high voltage is applied and the cover electrode 84a or 84b which is the ground potential. In addition, when the sputter particles adhere to the surface of the insulating member 90, insulating performance of the insulating member 90 is degraded. Consequently, there is a possibility that electrical insulation may not be ensured between the lens electrode 82 to which the high voltage is applied and the base plate 86 which is the ground potential.

According to the present embodiment, the lens unit 80 is provided with the plurality of gas exhaust ports 94a to 96a and 94b to 96b. Therefore, it is possible to generate a flow of the gas outward from the inside of the lens unit 80 through the plurality of gas exhaust ports 94a to 96a and 94b to 96b. For example, as illustrated in FIG. 10, it is possible to generate a flow F of the gas toward the vacuum pump 148 provided in the lower portion (−v-direction) of the vacuum chamber 140 through the plurality of downstream side gas exhaust ports 94b to 96b. At least a portion of the sputter particles generated inside the lens unit 80 is exhausted outward of the lens unit 80 along the flow F of the gas outward from the inside of the lens unit 80. As a result, it is possible to suppress a possibility that the sputter particles may adhere to the electrode body or the insulating member 90 provided inside the lens unit 80, and it is possible to suppress the discharge occurring between the electrode bodies or degradation of the insulating performance of the insulating member 90.

In the lens unit 80 illustrated in FIG. 10, the gas exhaust port is not provided at a position of 0 degrees where the adjacent first stem 76a exists. The first stem 76a is supported by the first insulator 77a, and when the sputter particles adhere to the first insulator 77a, the insulating performance of the first insulator 77a is degraded. Since the gas exhaust port is not provided at the position of 0 degrees where the adjacent first stem 76a exists, it is possible to suppress a possibility that the sputter particles may be scattered toward the first insulator 77a, and it is possible to suppress the degradation of the insulating performance of the first insulator 77a.

In order to suppress the possibility that the sputter particles may be scattered toward the first insulator 77a, it is preferable to provide the plurality of downstream side gas exhaust ports 94b to 96b at positions shifted from the first stem 76a by 45 degrees or larger in the circumferential direction. In particular, in the cover electrode adjacent to the high frequency accelerator 101 in the first stage, it is preferable that the gas exhaust port is not provided at the position in the +v-direction when viewed from the beamline BL. The cover electrodes adjacent to the high frequency accelerator 101 in the first stage are the downstream side cover electrode of the electrostatic quadrupole lens device 122 in the second stage and the upstream side cover electrode of the electrostatic quadrupole lens device 123 in the third stage.

In the high frequency accelerator 102 in the second stage, the second stem 76b exists at a position in the +u-direction when viewed from the beamline BL (refer to FIG. 6). Therefore, in a case of the cover electrode adjacent to the high frequency accelerator 102 in the second stage, it is preferable that the gas exhaust port is not provided at the position in the +u-direction when viewed from the beamline BL, and that the plurality of gas exhaust ports are provided at the positions in the +v-direction, the −v-direction, and the −u-direction. The cover electrodes adjacent to the high frequency accelerator 102 in the second stage are the downstream side cover electrode of the electrostatic quadrupole lens device 123 in the third stage and the upstream side cover electrode of the electrostatic quadrupole lens device 124 in the fourth stage.

In addition, in the high frequency accelerator 103 in the third stage, the third stem 76c exists at a position in the −u-direction when viewed from the beamline BL (refer to FIG. 6). Therefore, in a case of the cover electrode adjacent to the high frequency accelerator 103 in the third stage, it is preferable that the gas exhaust port is not provided at the position in the −u-direction when viewed from the beamline BL, and that the plurality of gas exhaust ports are provided at the positions in the +v-direction, the −v-direction, and the +u-direction. The cover electrodes adjacent to the high frequency accelerator 103 in the third stage are the downstream side cover electrode of the electrostatic quadrupole lens device 124 in the fourth stage and the upstream side cover electrode of the electrostatic quadrupole lens device 125 in the fifth stage.

In a case of the cover electrode which is not adjacent to the high frequency accelerator, the gas exhaust ports may be provided in four directions of ±v-direction and ±u-direction. That is, the cover electrode may have four gas exhaust ports provided at the positions of 0 degrees, 90 degrees, 180 degrees, and 270 degrees. The cover electrodes which are not adjacent to the high frequency accelerator are the upstream side and downstream side cover electrodes of the electrostatic quadrupole lens device 121 in the first stage and the upstream side cover electrode of the electrostatic quadrupole lens device 122 in the second stage.

According to the present embodiment, since the cutouts 88a and 88b are provided in the mounting portion 88, conductance of the gas flowing path toward the vacuum pump 148 can be improved. In particular, residual gas can effectively be exhausted by providing the cutouts 88a and 88b at locations where the lens units 80 in the plurality of stages are continuously provided. For example, the residual gas can effectively be exhausted from a space between the electrostatic quadrupole lens devices 121 and 122 in the first stage and the second stage which are continuously adjacent to each other.

According to the present embodiment, the residual gas can effectively be exhausted from the inside of the lens unit 80 through the plurality of gas exhaust ports 94a to 96a and 94b to 96b. Therefore, a degree of vacuum inside the lens unit 80 can be improved. In addition, the degree of vacuum can be improved by effectively exhausting the residual gas from a space around the lens unit 80 through the cutouts 88a and 88b. In this manner, the degree of vacuum in the beamline BL can be improved in the whole vacuum chamber 140. In this manner, it is possible to reduce influence of an interaction between the ion beam IB and the residual gas which may decrease the charge state of the ions forming the ion beam IB or may neutralize the ions. In this manner, transport efficiency of the ion beam IB in the beam acceleration unit 14 can be improved, and a decrease in the beam current of the ion beam IB output from the beam acceleration unit 14 can be suppressed.

The present embodiment may be applied to an ultra-high energy multistage linear acceleration unit that accelerates the ion beam IB to 4 MeV or higher. In order to accelerate the ion beam IB to 4 MeV or higher, it is necessary to further increase the acceleration voltages applied to the high frequency accelerators 101 to 115 in the plurality of stages, and it is necessary to further increase the focusing/defocusing voltages applied to the electrostatic quadrupole lens devices 121 to 139 in the plurality of stages. When the higher voltage is applied, the discharge is likely to occur between the electrode bodies. According to the present embodiment, it is possible to suppress a possibility that the electrode body or the insulating member may be contaminated by the sputter particles. Therefore, the discharge occurring between the electrode bodies can be suppressed.

The present embodiment may be applied to a high energy multistage linear acceleration unit that accelerates the ion beam IB containing multiply charged ions. The acceleration energy given to the ion beam IB in the high frequency accelerator is proportional to a product of the acceleration voltage applied to the high frequency accelerator and the charge state of the ions. Accordingly, the ions having a high charge state are used so that the acceleration energy can be increased compared to a case of using the ions having a low charge state. On the other hand, the ions having the high charge state (for example, the ions having a triple or higher charge state or quadruple or higher charge state) are likely to interact with the residual gas existing in the beamline BL, and the interaction lowers the charge state, thereby causing a loss in the beam transport. According to the present embodiment, the degree of vacuum of the beamline BL can be improved. Therefore, the loss of the multiply charged ions can be suppressed, and a decrease in the beam current of the ion beam IB output from the beam acceleration unit 14 can be suppressed.

The lens unit 80 according to the present embodiment may be applied to all of the electrostatic quadrupole lens devices 121 to 139 in the plurality of stages provided in the beam acceleration unit 14. That is, the gas exhaust port may be provided in the cover electrode included in each of the electrostatic quadrupole lens devices 121 to 139 in the plurality of stages. The lens unit 80 according to the present embodiment may be applied to the electrostatic quadrupole lens devices 121 to 139 in some stages out of the plurality of stages provided in the beam acceleration unit 14. That is, the lens unit 80 may be applied to at least one of the electrostatic quadrupole lens devices 121 to 139 in the plurality of stages.

The lens unit 80 according to the present embodiment may be applied to the electrostatic quadrupole lens device in at least one stage from the most upstream stage to a predetermined stage of the beam acceleration unit 14. For example, the lens unit 80 may be applied to the electrostatic quadrupole lens devices 121 to 125 in the first stage to the fifth stage illustrated in FIG. 5. The sputter particles generated in the lens unit 80 are likely to be generated when the energy of the ion beam IB is relatively low. Accordingly, the sputter particles are more likely to be generated in the upstream portion than in the downstream portion of the beam acceleration unit 14. For example, compared to the second linear acceleration unit 22b or the third linear acceleration unit 22c, the sputter particles are more likely to be generated in the first linear acceleration unit 22a. Therefore, the lens unit 80 may be applied to the upstream portion of the beam acceleration unit 14 in which the sputter particles are likely to be generated. In this manner, an advantageous effect of exhausting the sputter particles can easily be achieved. On the other hand, the gas exhaust port may not be provided in the cover electrode, in the electrostatic quadrupole lens devices (for example, 126 to 139) in the downstream portion of the beam acceleration unit 14 in which the sputter particles are less likely to be generated.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various modifications such as design changes can be added to the embodiment. The embodiment having the added modifications can also be included in the scope of the present invention.

In the above-described embodiment, a case has been described where the plurality of gas exhaust ports 94a to 96a and 94b to 96b are provided in each of the upstream side cover electrode 84a and the downstream side cover electrode 84b. In another embodiment, the plurality of gas exhaust ports may be provided in only one of the upstream side cover electrode 84a and the downstream side cover electrode 84b.

In the above-described embodiment, a case has been described where the plurality of gas exhaust ports 94a to 96a and 94b to 96b are provided in each of the upstream side cover electrode 84a and the downstream side cover electrode 84b. In another embodiment, only one gas exhaust port may be provided in at least one of the upstream side cover electrode 84a and the downstream side cover electrode 84b. Therefore, at least one of the upstream side cover electrode 84a and the downstream side cover electrode 84b may have at least one gas exhaust port.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
a high energy multistage linear acceleration unit for accelerating an ion beam,
wherein the high energy multistage linear acceleration unit includes high frequency accelerators in a plurality of stages provided along a beamline through which the ion beam travels, and electrostatic quadrupole lens devices in a plurality of stages provided along the beamline,
the electrostatic quadrupole lens device in each of the stages includes
a plurality of lens electrodes facing each other in a radial direction perpendicular to an axial direction in which the beamline extends while the beamline is interposed between the plurality of lens electrodes facing each other, and disposed at an interval in a circumferential direction perpendicular to both the axial direction and the radial direction,
an upstream side cover electrode covering a beamline upstream side of the plurality of lens electrodes, and including a beam incident port opening in the axial direction, and
a downstream side cover electrode covering a beamline downstream side of the plurality of lens electrodes, and including a beam exiting port opening in the axial direction, and
at least one of the upstream side cover electrode and the downstream side cover electrode which are included in the electrostatic quadrupole lens device in at least one of the plurality of stages includes at least one gas exhaust port opening in the radial direction.

2. The ion implanter according to claim 1,
wherein the at least one gas exhaust port is provided at a position farther away from the beamline in the radial direction than the plurality of lens electrodes.

3. The ion implanter according to claim 1,
wherein the at least one gas exhaust port is provided at a position shifted in the circumferential direction from each of the plurality of lens electrodes.

4. The ion implanter according to claim 3,
wherein the at least one gas exhaust port is provided at a position shifted by 45 degrees in the circumferential direction from at least one of the plurality of lens electrodes.

5. The ion implanter according to claim 1,
wherein the at least one gas exhaust port includes a plurality of gas exhaust ports provided at different positions in the circumferential direction.

6. The ion implanter according to claim 1,
wherein the at least one gas exhaust port is formed as a slit extending in the circumferential direction.

7. The ion implanter according to claim 1,
wherein the at least one gas exhaust port is formed as a mesh or a small aperture array.

8. The ion implanter according to claim 1,
wherein the electrostatic quadrupole lens device in each of the stages further includes a plurality of insulating members respectively supporting the plurality of lens electrodes, and each of the plurality of insulating members is provided to extend outward in the radial direction from the corresponding lens electrode, and
a position of the at least one gas exhaust port in the axial direction is located between positions of end portions of the plurality of lens electrodes in the axial direction and positions of the plurality of insulating members in the axial direction.

9. The ion implanter according to claim 1,
wherein the high frequency accelerator in each of the stages includes a hollow cylindrical high frequency electrode through which the ion beam passes, a stem extending outward in the radial direction from the high frequency electrode, a high frequency resonator connected to the high frequency electrode via the stem, and an insulator supporting the stem, and
the at least one gas exhaust port is provided at a position shifted in the circumferential direction from the stem extending from the high frequency electrode adjacent to the cover electrode in the axial direction.

10. The ion implanter according to claim 9,
wherein the at least one gas exhaust port is provided at a position shifted by 45 degrees or more in the circumferential direction from the stem.

11. The ion implanter according to claim 9,
wherein the at least one gas exhaust port includes a first gas exhaust port provided at a position shifted by 90 degrees in the circumferential direction from the stem, a second gas exhaust port provided at a position shifted by 180 degrees in the circumferential direction from the stem, and a third gas exhaust port provided at a position shifted by 270 degrees in the circumferential direction from the stem.

12. The ion implanter according to claim 1,
wherein the electrostatic quadrupole lens device in each of the stages further includes a base plate supporting the plurality of lens electrodes and the cover electrodes, and a mounting portion extending from the base plate in the axial direction and fixed to a vacuum chamber of the high energy multistage linear acceleration unit, and
the mounting portion included in the electrostatic quadrupole lens device in the at least one of the plurality of stages includes a cutout through which gas inside the vacuum chamber passes.

13. The ion implanter according to claim 12,
wherein the cutout is provided between the beamline and a vacuum exhaust system connected to the vacuum chamber.

14. The ion implanter according to claim 12,
wherein the cutout is formed as a mesh or a small aperture array.

15. The ion implanter according to claim 12,
wherein the electrostatic quadrupole lens device including the cutout is disposed adjacent to another electrostatic quadrupole lens device in the axial direction.

16. The ion implanter according to claim 1,
wherein the electrostatic quadrupole lens device in the at least one of the plurality of stages is provided in at least one stage from an uppermost stage to a predetermined stage in the high energy multistage linear acceleration unit.

17. The ion implanter according to claim 1,
wherein the high energy multistage linear acceleration unit accelerates the ion beam including multiply charged ions.

18. The ion implanter according to claim 1,
wherein the high energy multistage linear acceleration unit accelerates the ion beam up to energy of 4 MeV or higher.

19. The ion implanter according to claim 1,
wherein the high frequency accelerators in the plurality of stages are provided in 10 or more stages, and the electrostatic quadrupole lens devices in the plurality of stages are provided in 10 or more stages.

20. An electrostatic quadrupole lens device comprising:
a plurality of lens electrodes facing each other in a radial direction perpendicular to an axial direction in which a beamline extends while the beamline is interposed between the plurality of lens electrodes facing each other, and disposed at an interval in a circumferential direction perpendicular to both the axial direction and the radial direction;
an upstream side cover electrode covering a beamline upstream side of the plurality of lens electrodes, and including a beam incident port opening in the axial direction; and
a downstream side cover electrode covering a beamline downstream side of the plurality of lens electrodes, and including a beam exiting port opening in the axial direction,
wherein at least one of the upstream side cover electrode and the downstream side cover electrode includes at least one gas exhaust port opening in the radial direction.

* * * * *